United States Patent
Franke et al.

(10) Patent No.: US 9,491,646 B2
(45) Date of Patent: Nov. 8, 2016

(54) MEASURING DEVICE AND A METHOD FOR MEASURING A SIGNAL WITH SEVERAL COMPONENT SIGNALS

(75) Inventors: Jens Franke, Germering (DE); Florian Lang, Gilching (DE); Michael Simon, Woerth (DE); Bjoern Coenen, Munich (DE); Markus Niedl, Wolfratschausen (DE); Ronald Tonn, Woerthsee (DE); Johannes Steffens, Rosenheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/123,092

(22) PCT Filed: Jun. 5, 2012

(86) PCT No.: PCT/EP2012/060582
§ 371 (c)(1),
(2), (4) Date: Oct. 15, 2014

(87) PCT Pub. No.: WO2012/168228
PCT Pub. Date: Dec. 13, 2012

(65) Prior Publication Data
US 2015/0111506 A1 Apr. 23, 2015

(30) Foreign Application Priority Data
Jun. 10, 2011 (DE) .......... 10 2011 077 390

(51) Int. Cl.
*H04B 1/30* (2006.01)
*H04W 24/08* (2009.01)
(Continued)

(52) U.S. Cl.
CPC .......... *H04W 24/08* (2013.01); *G01R 13/0236* (2013.01); *G01R 23/16* (2013.01); *G01R 23/18* (2013.01); *H04L 1/242* (2013.01); *H04W 84/042* (2013.01)

(58) Field of Classification Search
CPC ................. H04L 1/242; G06F 3/048
See application file for complete search history.

(56) References Cited

U.S. PATENT DOCUMENTS

| 6,307,896 B1 * | 10/2001 | Gumm ............. H04B 1/30 348/E17.003 |
| 2003/0041300 A1 * | 2/2003 | Burns ............. G06F 7/724 714/784 |

(Continued)

FOREIGN PATENT DOCUMENTS

| DE | 60017573 T2 | 5/2002 |
| DE | 102010037627 A1 | 3/2011 |

(Continued)

OTHER PUBLICATIONS

International Preliminary Report on Patentability (Chapter I), PCT/EP2012/060582, Dec. 27, 2013.

*Primary Examiner* — Cindy Trandai
(74) *Attorney, Agent, or Firm* — Potomac Technology Law, LLC

(57) ABSTRACT

A measuring device for measuring a signal with a first component signal and at least one second component signal comprises a high-frequency processing device, which is embodied to mix the signal in order to form an intermediate-frequency signal and to digitize the latter in order to form a digital composite signal. The measuring device further comprises a digital mixer, which is embodied to generate a first digital composite test signal and a second digital composite test signal subject to a displacement of the frequency of the digital composite signal. Moreover, the measuring device comprises a digital filter, which is embodied to filter the first digital composite test signal in order to form a first digital test signal and to filter the second digital composite test signal in order to form a second digital test signal.

17 Claims, 5 Drawing Sheets

(51) Int. Cl.
*G01R 13/02* (2006.01)
*G01R 23/16* (2006.01)
*G01R 23/18* (2006.01)
*H04L 1/24* (2006.01)
*H04W 84/04* (2009.01)

(56) References Cited

U.S. PATENT DOCUMENTS

| | | | |
|---|---|---|---|
| 2005/0021261 A1* | 1/2005 | Nara | G01R 35/005 |
| | | | 702/75 |
| 2005/0232214 A1* | 10/2005 | Dottling | H03M 13/6362 |
| | | | 370/342 |
| 2005/0261847 A1 | 11/2005 | Nara | |
| 2008/0151772 A1* | 6/2008 | Akita | H04B 17/23 |
| | | | 370/252 |
| 2008/0317173 A1* | 12/2008 | Kim | H04L 25/0204 |
| | | | 375/341 |
| 2011/0070858 A1 | 3/2011 | He et al. | |
| 2011/0249184 A1* | 10/2011 | Elsherif | H04N 5/21 |
| | | | 348/572 |
| 2013/0100154 A1* | 4/2013 | Woodings | G06T 11/206 |
| | | | 345/589 |

FOREIGN PATENT DOCUMENTS

| | | |
|---|---|---|
| EP | 1207627 A1 | 5/2002 |
| EP | 1592131 A1 | 11/2005 |
| EP | 1669142 A1 | 6/2006 |
| EP | 2096451 A1 | 9/2009 |
| EP | 2148498 A1 | 1/2010 |
| EP | 2045926 B1 | 3/2011 |
| JP | 2011182114 A | 9/2011 |

* cited by examiner

MEASURING DEVICE AND A METHOD FOR MEASURING A SIGNAL WITH SEVERAL COMPONENT SIGNALS

CROSS-REFERENCE TO RELATED APPLICATION(S)

The present application is a national phase application of PCT application No. PCT/EP2012/060582, filed Jun. 5, 2012, and claims priority to German Patent Application No. DE 102011077390.8, filed Jun. 10, 2011, the entire contents of which are incorporated herein by reference.

FIELD

The invention relates to a measuring device, especially a spectrum analyzer, for measuring a signal, such as a broadband signal with several component signals, and a corresponding method.

BACKGROUND

Signals which contain several component signals are conventionally analyzed component-signal by component-signal by measuring devices. For this purpose, a device under test is usually supplied with an excitation signal, and a resulting test signal is mixed in an analog manner with a local oscillator signal to form an intermediate-frequency signal. This signal is then limited by analog filtering to the frequency range relevant for a first component signal. The resulting narrow-band test signal is now digitized and further processed. Following this, the same process is repeated for further component signals, which are contained in the original signal. Accordingly, EP 1 592 131 A1 discloses a measuring device which contains the above-named procedure. The disadvantage here is that the component signals cannot be investigated simultaneously. In particular, in the case of base stations which broadcast signals of different communications standards, for example, GSM, UMTS, LTE, simultaneously, interactions between the individual component signals cannot be investigated in an adequate manner with conventional measuring devices.

Accordingly, there is a need for a measuring device and a measuring method which can measure signals composed of several component signals.

SUMMARY

Embodiments of the present invention advantageously addresses the foregoing requirements and needs, as well as others, by providing a measuring device and a measuring method which can measure signals composed of several component signals.

According to an example embodiment of the present invention, a measuring device for measuring a signal with a first component signal and at least one second component signal comprises a high-frequency processing device, which is embodied to mix the signal in order to form an intermediate-frequency signal and to digitize the latter in order to form a digital composite signal. By way of further example, the measuring device further comprises a digital mixer, which is embodied to generate a first digital composite test signal and a second digital composite test signal subject to a displacement of the frequency of the digital composite signal. By way of yet a further example, the measuring device comprises a digital filter, which is embodied to filter the first digital composite test signal in order to form a first digital test signal and to filter the second digital composite test signal in order to form a second digital test signal. In this manner, an analysis of the component signals during an identical observation period is made possible.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION

A measuring device and a measuring method which can measure signals composed of several component signals, is described.

Figure 1:
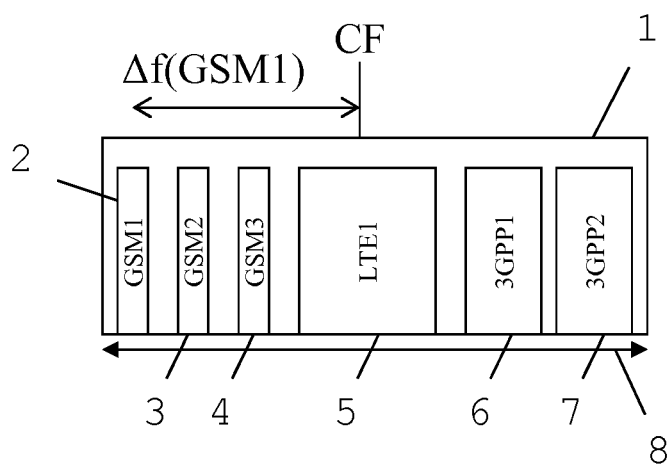
FIG. 1 illustrates a first exemplary signal.
Figure 2:
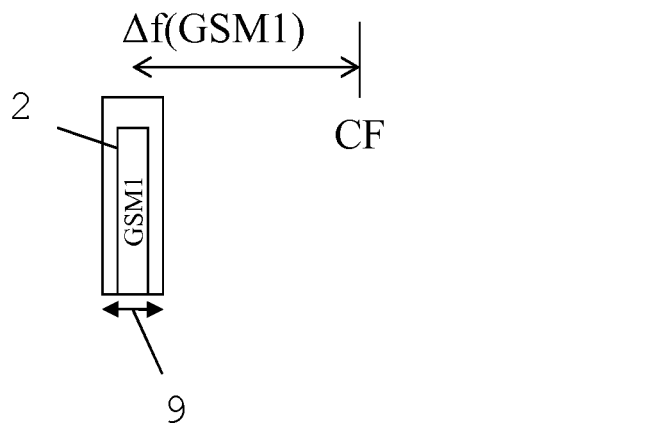
FIG. 2 illustrates a second exemplary signal.

Initially, the problem addressed by and the basic functioning of embodiments of the invention are explained on the basis of FIGS. 1-2. Following this, the structure and method of functioning of an exemplary embodiment of the measuring device according to the invention is illustrated on the basis of FIGS. 3-5. Finally, with reference to FIG. 6, the method of functioning of an exemplary embodiment of the method according to the invention is shown. The presentation and description of identical elements in similar drawings have not been repeated in some cases.

FIG. 1 shows a first exemplary signal 1. In this context, the display is provided in the frequency domain. The signal 1 contains a plurality of spectral component signals 2-7 and provides a bandwidth 8. The bandwidth 8 results from the bandwidth of the component signals 2-7 and the necessary intermediate spaces between the component signals 2-7.

The signal 1 provides a center frequency CF. The component signals 2, 3 and 4, for example, are GSM signals. The component signal 5, for example, is an LTE signal. The component signals 6 and 7, for example, are UMTS signals. The different bandwidth dependent upon the respective communications standard is clearly visible here. The center frequency of the signal 1 differs from the center frequency of the component signal 2 by Δf (GSM1).

FIG. 2 shows the component signal 2 extracted from FIG. 1. FIG. 2 additionally shows the center frequency CF of the signal 1 from FIG. 1. The bandwidth 9 of the extracted component signal 2 is also clearly identifiable in FIG. 2. This bandwidth 9 corresponds to the bandwidth of the component signal 2 and also to a necessary shoulder bandwidth. A conventional measuring device extracts from the signal 1 only the bandwidth 9 of the component signal 2 illustrated in FIG. 2, digitizes it and further processes it. Accordingly, with a conventional measuring device, several component signals are processed one after the other.

With the measuring device according to embodiments of the invention and the method according to embodiments of the invention, the entire signal 1 from FIG. 1 is mixed to an intermediate frequency and digitized. The digitized signal is then mixed in each case to the required center frequency of the component signal to be investigated and limited in its bandwidth corresponding to the respective component signal. This processing can be implemented simultaneously or in succession for several component signals. It is particularly advantageous here that component signals which have been received at a common time can be compared with one another.

Figure 3:
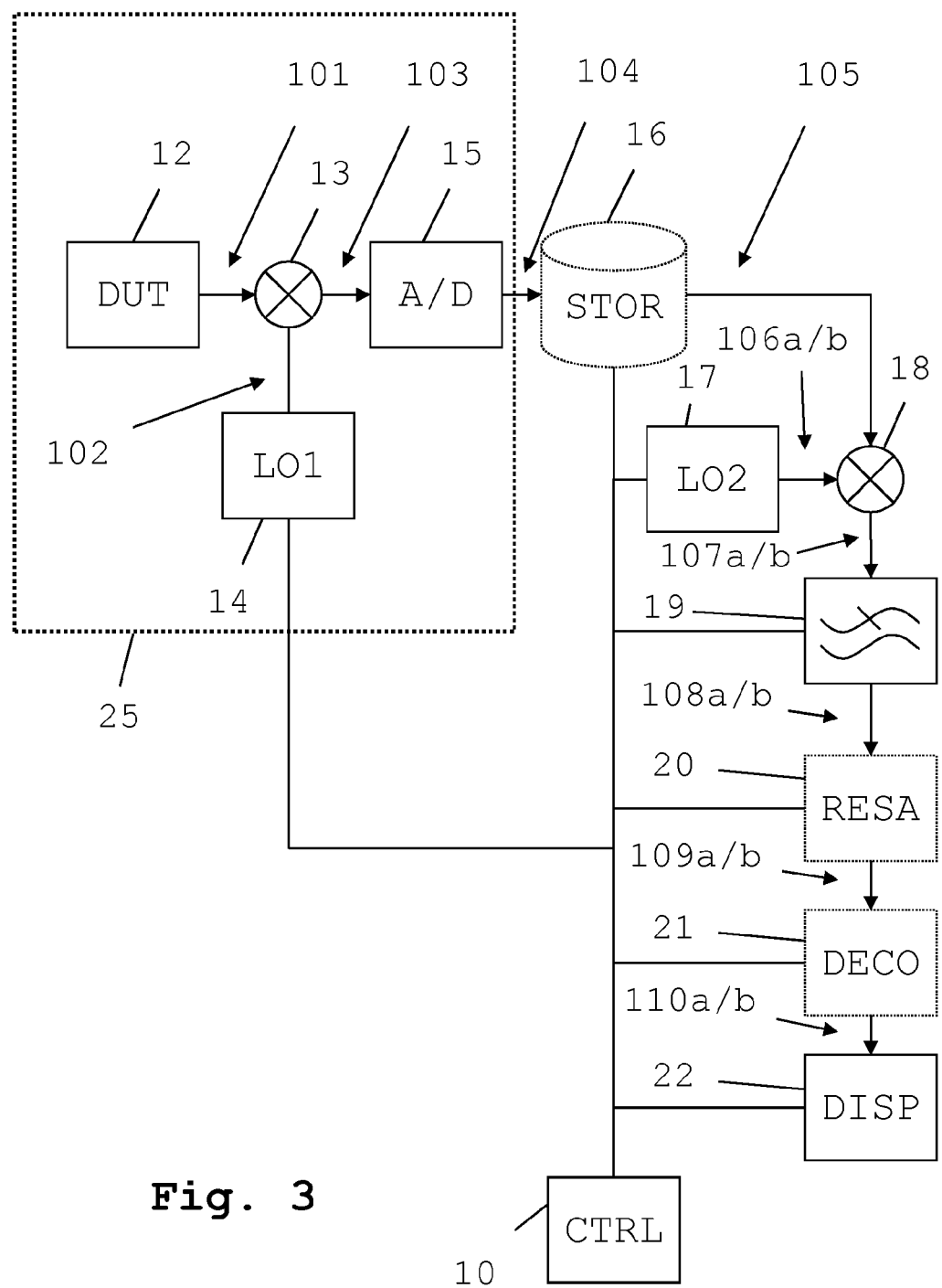
FIG. 3 illustrates a block-circuit diagram of the measuring device according to example embodiments of the present invention.

FIG. 3 shows a first exemplary embodiment of the measuring device according to the invention. A device under test 12 is connected to a mixer 13. The mixer 13 is connected to a local oscillator 14 and an analog-digital converter 15. In this context, the local oscillator 14 is also connected to the control device 10. The mixer 13, the local oscillator 14 and the analog-digital converter 15 together form a high-frequency processing device 25. The device under test 12 is not a component of this device.

The analog-digital converter 15 is connected to a storage device 16. The storage device 16 is also connected to the control device 10. Moreover, the storage device 16 is connected to a digital mixer 18, which is connected to a digital local oscillator 17. This is also connected to the control device 10. Moreover, the mixer 18 is connected to a filter 19. The filter 19 is also connected to the control device 10. Furthermore, the filter 19 is connected to a data-rate matching device 20. The latter is also connected to the control device 10. It is additionally connected to a decoding device 21, which is also connected to the control device 10. Moreover, the decoding device 21 is connected to a display device 22, which is also connected to the control device 10.

The device under test 12 generates a signal 101. This is transmitted to the mixer 13. In this context, the signal contains several component signals. These can be from different telecommunications standards. The mixer 13 mixes the signal 101 with a local oscillator signal 102, which is generated by the local oscillator 14 subject to the control of the control device 10. The resulting intermediate-frequency signal 103 contains the entire information content of the signal 101, but provides a different center frequency. The intermediate-frequency signal 103 is then digitized by an analog-digital converter 15 to form a digital composite signal 104. This digital composite signal 104 is then buffered by the storage device 16.

Subject to the control of the control device 10, the storage device 16 outputs the stored digital composite signal 105 to the mixer 18 which mixes it with a first local oscillator signal 106a. This local oscillator signal 106a is generated by the local oscillator 17 subject to the control of the control device 10. The signal processing is implemented digitally downstream of the analog-digital converter 15, that is to say, a digital mixing with a digital signal 106a is performed. In this context, the frequency of the local oscillator signal 106a is selected in such a manner that the center frequency of the first digital composite test signal 107a resulting from the mixing corresponds to the center frequency of the component signal under investigation. The frequency of the digital composite signal 105 is accordingly displaced through the mixing by the mixer 18 in such a manner that the resulting, first digital composite test signal 107a can be readily further processed.

This signal 107a is now supplied to the digital filter 19. The digital filter 19 limits the bandwidth of the first digital composite test signal 107a to the bandwidth of the component signal presently under investigation. The filter 19 may comprise a low-pass filter. Alternatively, a band-pass filter can be used. The digital filter 19 generates a first digital test signal 108a as its output signal. This first digital test signal 108a now contains only the information content of the component signal presently under investigation. It is then supplied to the data-rate matching device 20, which removes data points unnecessary for investigating the respective component signal and therefore reduces the data rate of the first digital test signal 108a. In this context, the reduction is implemented dependent upon the respective communications standard. Passing through the data-rate matching device 20 is optional here.

The resulting signal 109a is supplied to a decoding device 21, which decodes the signal. The decoded signal 110a is supplied to the display device 22 and displayed by the latter. Passing through the decoding device 21 is also optional in this case. As an alternative, the un-decoded data can also be displayed on the display device 22. The digital filter 19, the data-rate matching device 20, the decoding device 21 and the display device 22 are also controlled by the control device 10. The data-rate matching device 20 is also adjusted by the control device 10 for the component signal presently under investigation. This also applies for the decoding device 21 and the display device 22.

After a first component signal of the buffered digital composite test signal 105 has been processed as described above, this procedure is repeated for a second component signal and possibly further component signals. The control device 10 now adjusts the local oscillator signal 106b in such a manner that the center frequency of the signal 107b resulting from the mixing corresponds to the center frequency of the component signal presently under investigation. The digital filter 19 is also adjusted in order to allow the bandwidth of the component signal under investigation to pass and to remove signal components going beyond this. By analogy with the procedure described above, a second digital test signal 108b is generated and further processed in the form of the signals 109b and 110b.

As an alternative, the digital composite signal 104 can then be processed directly, provided only one component signal is to be investigated. However, if a second component signal is to be investigated, the digital composite test signal 105 must be buffered as described by the storage device 16 and further processed in the form of the stored digital composite signal 105.

In this context, the processing of several component signals through the functional blocks 16-22 is implemented section by section in succession. That is to say, initially, a first time section of a first component signal is processed. Following this, an identical time section of a second component signal is processed. After all of the component signals to be displayed presently have been processed, the next time section of the first component signal is processed. In this context, the recording by the storage device 16 is implemented continuously.

Alternatively, a parallel processing of several component signals is also possible. For this purpose, the measuring device comprises at least a twofold embodiment of the functional blocks 17-21. In this case, the control device 10 controls these functional blocks 17-21 in parallel. A recording of the stored digital composite signal 105 is also possible section by section.

Alternatively, the device under test can also be excited by an excitation device subject to control by the control device 10 in order to generate the signal 101.

Figure 4:
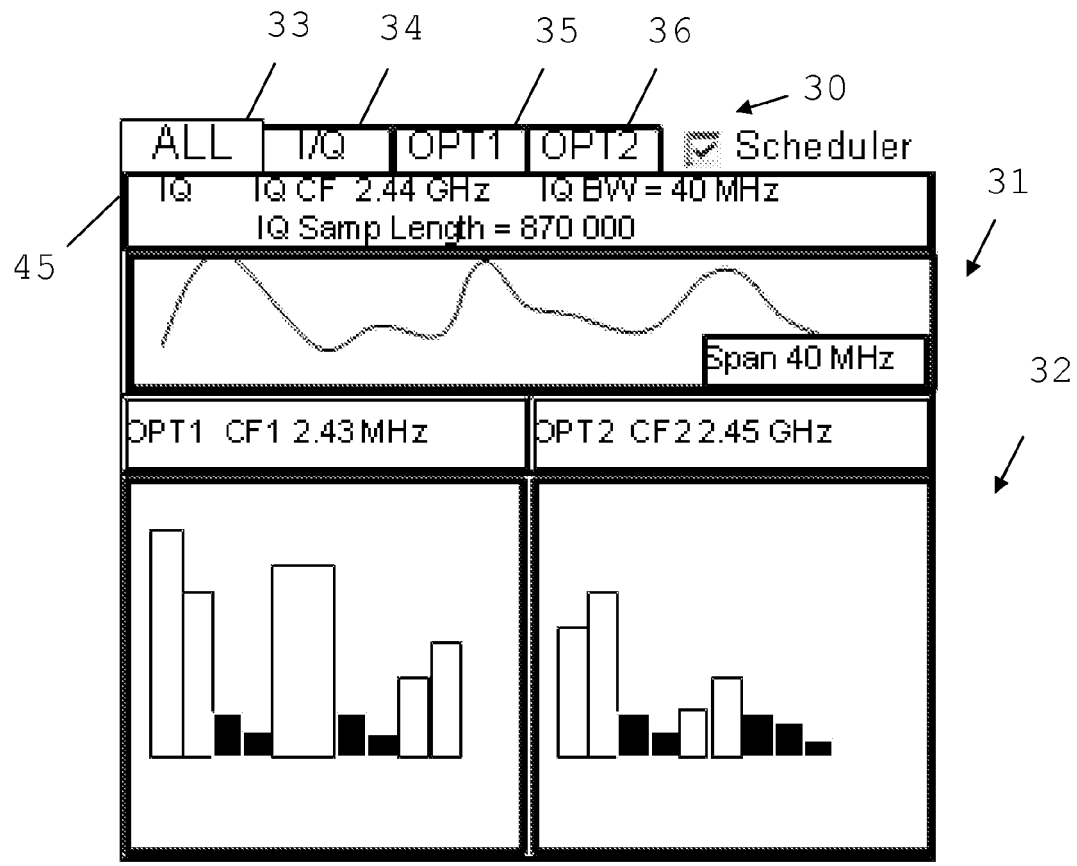
FIG. 4 illustrates a first display of the measuring device according to example embodiments of the present invention.

FIG. 4 shows a second exemplary embodiment of the measuring device according to the invention. The structure of the display device 22 in a first display mode is illustrated here. In this context, the display device provides a first display region 30, which contains several control buttons 33-36. The control button 33 corresponds to the display of all of the component signals. The control button 34 corresponds to the display of the in-phase component and the quadrature component. The control button 35 corresponds to the display of a first component signal. The control button 36 corresponds to the display of a second component signal. In the present display mode, the control button 33 has been selected. That is, all of the component signals are displayed. The current signal contains two component signals.

The display device contains a second display region 31 on which the digital composite test signal is displayed in the time domain. Additionally, the display device contains a third display region 32 in which the two component signals are displayed in the frequency domain. Accordingly, it is possible to obtain an overview of all of the component signals contained in the signal within this first display mode.

Figure 5:
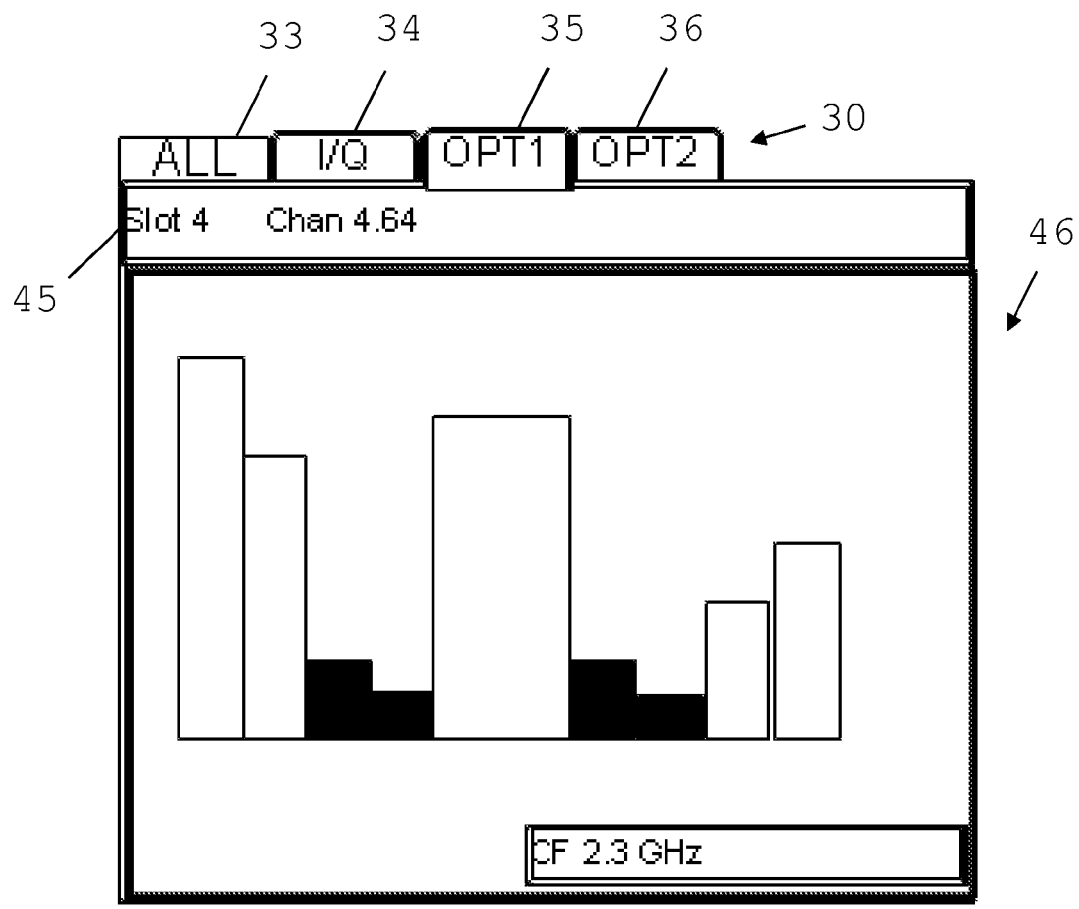
FIG. 5 illustrates a second display of an exemplary embodiment of the measuring device according to example embodiments of the present invention.

FIG. 5 shows the display device 22 from FIG. 3 in a second display mode. Here, the control button 35, which corresponds to the display of the first component signal, has been selected. The display device now contains the first display region 30 from FIG. 4. Additionally, it contains a fourth display region 46 on which the first component signal is displayed in the frequency domain.

With the present signal, four display modes are possible, corresponding to the control buttons 33-36. Further display modes are possible with a signal which contains a large number of component signals. Accordingly, a display mode in which all component signals are displayed is always possible. Additionally, a display mode in which one component signal is displayed in each case is always possible. Moreover, with more than two component signals, display modes in which two or more component signals are displayed simultaneously in each case, are possible.

Figure 6:
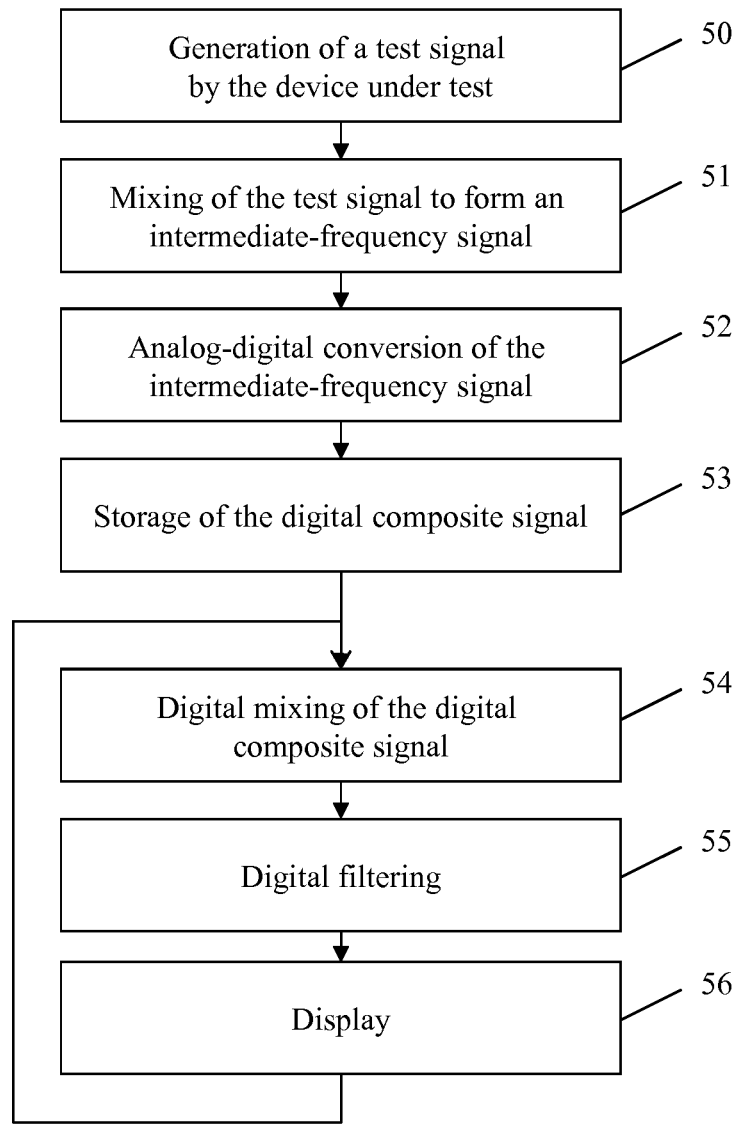
FIG. 6 illustrates a flow chart of the method according to example embodiments of the present invention.

Finally, FIG. 6 shows a flow chart of an exemplary embodiment of the method according to the invention. In a first step 50, a device under test generates a test signal with several component signals. These component signals can be associated with different telecommunications standards. Alternatively, the device under test for the generation of the test signal can be excited by means of an excitation signal. In a second step 51, the resulting analog signal is mixed with a local oscillator signal to form an intermediate-frequency signal. As a result, the frequency of the signal is reduced, which reduces the requirements for the further components of a measuring device.

In a third step 52, the intermediate-frequency signal is sampled and digitized. The resulting digital composite signal here contains the entire information content of the original signal. In a fourth step 53, the digital composite signal is stored. Following this, in a fifth step 54, the digital composite signal is mixed digitally with a local oscillator signal. This mixing is implemented in such a manner that the center frequency of the resulting composite test signal corresponds to the center frequency of the component signal presently under investigation.

The resulting digital composite test signal continues to contain the entire information content of the original signal. In a subsequent sixth step 55, the digital composite test signal is filtered digitally, that is, frequency components outside the presently investigated component signal are removed.

In a seventh step 56, the resulting digital test signal is displayed by a display device. If further component signals are to be investigated, the process continues with the fifth step 54. In this context, the mixing is implemented in such a manner that the component signal now under investigation comes to be disposed in the center of the digital filter from the sixth step. Accordingly, the width of the digital filter is adjusted in such a manner that the entire component signal is registered. Optionally, a reduction of the data rate can be implemented additionally as a part of the sixth step 55. As a part of the seventh step 56, before the display, a decoding can be additionally implemented.

The invention is not restricted to the exemplary embodiment presented. Accordingly, the signal can contain component signals from an extremely diverse range of communications standards. Moreover, it is not necessary for the signal to be filled with component signals in a gap-free manner. All of the features described above or illustrated in the drawings can be advantageously combined with one another within the scope of the invention. More than two component signals of arbitrary telecommunications standards can be present, also combined, within the signal.

The invention claimed is:

1. A measuring device for measuring a signal, wherein the signal includes a first component signal and at least a second component signal, the measuring device comprising:
    a high-frequency processing device configured to mix the signal with an initial local oscillator signal to form an intermediate-frequency signal, and to digitize the intermediate-frequency signal to form a digital composite signal, wherein the digital composite signal includes information content of at least the first component signal and the second component signal;
    a digital mixer configured to mix the digital composite signal with a first local oscillator signal to generate a first digital composite test signal and to mix the digital composite signal with a second local oscillator signal to generate a second digital composite test signal, wherein the first and second digital composite test signals are each subject to a displacement in frequency from the frequency of the digital composite signal; and
    a digital filter configured to filter the first digital composite test signal to form a first digital test signal and to filter the second digital composite test signal to form a second digital test signal.

2. The measuring device according to claim 1, wherein:
    each of the first digital composite test signal and the second digital composite test signal includes the information content of one or more of the first component signal and the second component signal;
    the first digital test signal includes the information content of the first component signal;
    the second digital test signal includes the information content of the second component signal; and
    the first digital test signal and the second digital test signal are each of a narrower bandwidth than that of the first digital composite test signal and the second digital composite test signal, respectively.

3. The measuring device according to claim 1, wherein the first digital composite test signal and the second digital composite test signal are each of a different center frequency than that of the other.

4. The measuring device according to claim 1, wherein the high-frequency processing device comprises:
    an analog mixer configured to perform the mixing of the signal with the initial local oscillator signal to form the intermediate-frequency signal; and
    an analog-digital converter configured to perform the digitizing of the intermediate-frequency signal to form the digital composite signal.

5. The measuring device according to claim 1, further comprising:

a display device configured to display a plurality of display modes, wherein, in a first display mode, the display device provides a first display region configured to display a selection screen for selection of at least one of the display modes, provides a second display region configured to display the digital composite signal in one or more of the time domain and the frequency domain, and provides a third display region configured to display at least the first digital test signal and the second digital test signal simultaneously.

6. The measuring device according to claim 5, wherein, in a second display mode, the display device provides the first display region configured to display the selection screen for selection of at least one of the display modes, and provides a fourth display region configured to display one or more of the first digital test signal and the second digital test signal in a more detailed view by comparison with the view of the third display region.

7. The measuring device according to claim 1, wherein the digital mixer is configured to generate the first digital composite test signal and the second digital composite test signal, and the digital filter is configured to generate the first digital test signal and the second digital test signal, respectively section by section in succession.

8. The measuring device according to claim 1, further comprising:
a data-rate matching device configured to reduce a data rate of the first digital test signal and a data rate of the second digital test signal section by section in succession.

9. The measuring device according to claim 1, wherein the first component signal and the second component signal are configured in accordance with different communications standards, the measuring device further comprising:
a decoding device configured to decode a signal derived at least in part based on the first digital test signal and a first of the different communications standards, and a signal derived at least in part based on the second digital test signal and a second of the different communications standards, section by section in succession.

10. A method for measuring a signal, wherein the signal includes a first component signal and at least a second component signal, the method comprising:
mixing the signal with an initial local oscillator signal to form an intermediate-frequency signal;
digitizing the intermediate-frequency signal to form a digital composite signal, wherein the digital composite signal includes information content of at least the first component signal and the second component signal;
mixing the digital composite signal with a first local oscillator signal to generate a first digital composite test signal and mixing the digital composite signal with a second local oscillator signal to generate a second digital composite test signal, wherein the first and second digital composite test signals are each subject to a displacement in frequency from the frequency of the digital composite signal; and
filtering the first digital composite test signal to form a first digital test signal, and filtering the second digital composite test signal to form a second digital test signal.

11. The method according to claim 10, wherein:
each of the first digital composite test signal and the second digital composite test signal includes the information content of one or more of the first component signal and the second component signal;
the first digital test signal includes the information content of the first component signal;
the second digital test signal includes the information content of the second component signal; and
the first digital test signal and the second digital test signal are each of a narrower bandwidth than that of the first digital composite test signal and the second digital composite test signal, respectively.

12. The method according to claim 10, wherein the first digital composite test signal and the second digital composite test signal are each of a different center frequency than that of the other.

13. The method according to claim 10, further comprising:
displaying, in a first display mode, a first display region, which displays a selection screen for selection of at least one of a plurality of display modes, a second display region, which displays the digital composite signal in one or more of the time domain and the frequency domain, and a third display region, which displays at least the first digital test signal and the second digital test signal simultaneously.

14. The method according to claim 13, further comprising:
displaying, in a second display mode, the first display region, which displays the selection screen for selection of at least one of the plurality of display modes, and a fourth display region, which displays one or more of the first digital test signal and the second digital test signal in a more detailed view by comparison with the view of the third display region.

15. The method according to claim 10, wherein the first digital composite test signal and the second digital composite test signal, and the first digital test signal and the second digital test signal, respectively, are generated section by section in succession.

16. The method according to claim 10, further comprising:
reducing a data rate of the first digital test signal and a data rate of the second digital test signal section by section in succession.

17. The method according to claim 10, wherein the first component signal and the second component signal are configured in accordance with different communications standards, the method further comprising:
decoding a signal derived at least in part based on the first digital test signal and a first of the different communications standards, and a signal derived at least in part based on the second digital test signal and a second of the different communications standards, section by section in succession.

* * * * *